United States Patent
Coskun et al.

(10) Patent No.: US 12,242,789 B2
(45) Date of Patent: *Mar. 4, 2025

(54) OVERLAYING ON LOCALLY DISPOSITIONED PATTERNS BY ML BASED DYNAMIC DIGITAL CORRECTIONS (ML-DDC)

(71) Applicant: Applied Materials, Inc., Santa Clara, CA (US)

(72) Inventors: Tamer Coskun, San Jose, CA (US); Aidyn Kemeldinov, Santa Clara, CA (US); Chung-Shin Kang, San Jose, CA (US); Uwe Hollerbach, Fremont, CA (US); Thomas L. Laidig, Richmond, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/439,287

(22) Filed: Feb. 12, 2024

(65) Prior Publication Data
US 2024/0249062 A1 Jul. 25, 2024

Related U.S. Application Data

(63) Continuation of application No. 17/396,453, filed on Aug. 6, 2021, now Pat. No. 11,934,762.

(51) Int. Cl.
*G06F 30/39* (2020.01)
*G06F 30/392* (2020.01)
(Continued)

(52) U.S. Cl.
CPC .......... *G06F 30/392* (2020.01); *G06N 20/00* (2019.01); *H01L 21/68* (2013.01)

(58) Field of Classification Search
CPC ...... G06F 30/392; G06N 20/00; G06N 3/088; G06N 3/09; G06N 5/01; H01L 21/68
(Continued)

(56) References Cited

U.S. PATENT DOCUMENTS

| 4,783,695 A | 11/1988 | Eichelberger et al. |
| 4,835,704 A | 5/1989 | Eichelberger et al. |

(Continued)

FOREIGN PATENT DOCUMENTS

| CN | 112748644 A | 5/2021 |
| WO | 2021096530 A1 | 5/2021 |

OTHER PUBLICATIONS

International Search Report/ Written Opinion issued to PCT/US2022/034170 on Oct. 26, 2022.

*Primary Examiner* — Paul Dinh
(74) *Attorney, Agent, or Firm* — Patterson + Sheridan, LLP

(57) ABSTRACT

Systems and methods disclosed are generally related to masklessly developing connections between a chip-group and a design connection point on a substrate. In placement of the chip-group on the substrate, according to certain embodiments the chip-group may be dispositioned relative to an expected position per a substrate layout design, causing a connection misalignment with the design connection point. According to certain embodiments, a machine learning (ML) model is trained on historical and simulated pixel models of chip-group connections and design connection points. Upon determining the chip-group misalignment by a metrology measurement, the trained ML model determines a pixel model to connect the misaligned chip-group, and causes the pixel model to be exposed to a substrate with a digital lithography tool, thereby connecting the dispositioned chip-group to the design connection point.

20 Claims, 13 Drawing Sheets

(51) Int. Cl.
*G06N 20/00* (2019.01)
*H01L 21/68* (2006.01)

(58) Field of Classification Search
CPC ..... H01L 22/12; H01L 24/00; G03F 7/70291;
G03F 7/70433; G03F 7/70616
USPC ........................................................ 716/119
See application file for complete search history.

(56) References Cited

U.S. PATENT DOCUMENTS

| | | |
|---|---|---|
| 5,357,403 A | 10/1994 | Haller et al. |
| 2018/0046072 A1 | 2/2018 | Lutich |
| 2018/0120704 A1 | 5/2018 | van Kervinck et al. |
| 2020/0004132 A1 | 1/2020 | Johnson et al. |
| 2020/0356011 A1* | 11/2020 | Su .......................... G06F 30/398 |
| 2020/0380362 A1* | 12/2020 | Cao .......................... G06N 20/00 |
| 2022/0299881 A1* | 9/2022 | Zheng ..................... G03F 7/705 |

* cited by examiner

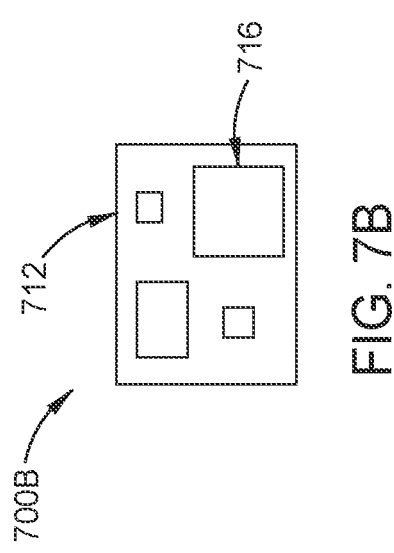
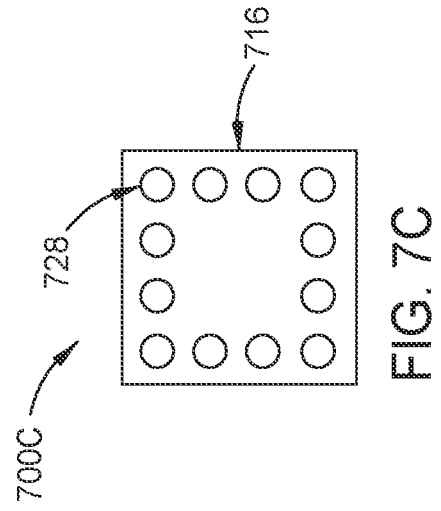
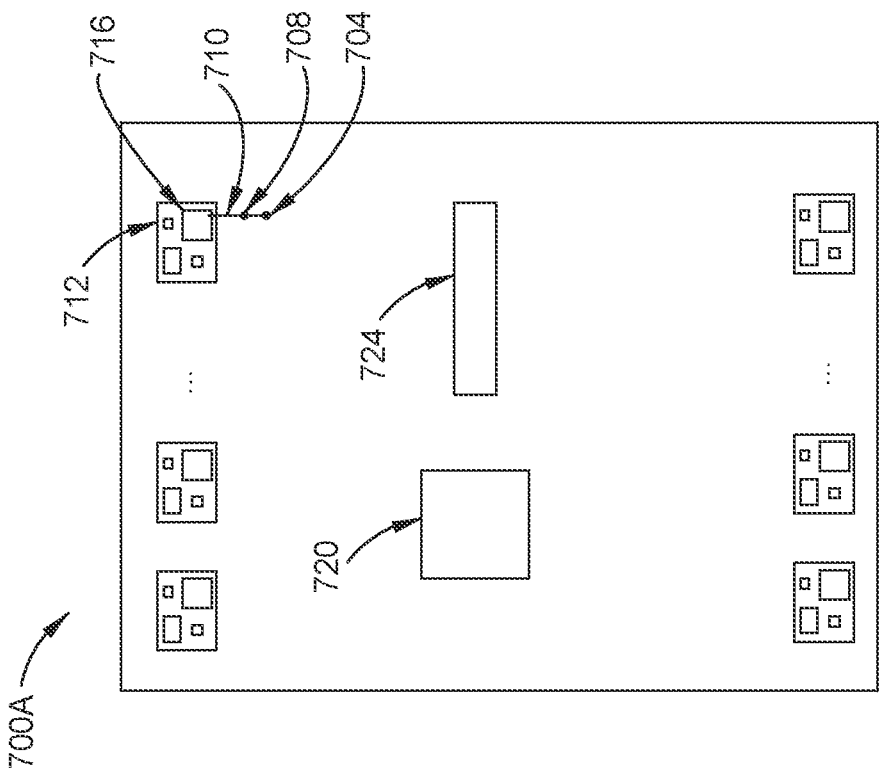

OVERLAYING ON LOCALLY DISPOSITIONED PATTERNS BY ML BASED DYNAMIC DIGITAL CORRECTIONS (ML-DDC)

CROSS-REFERENCE TO RELATED APPLICATIONS

This application is a continuation application of co-pending U.S. patent application Ser. No. 17/396,453, filed Aug. 6, 2021, the contents of which are incorporated herein by reference in their entirety.

BACKGROUND

Field

Embodiments of the present disclosure generally relate to substrate processing integrating pre-assembled components on a substrate, and more particularly to detection and correction of connections between dispositioned design components.

Description of the Related Art

As demand for additional functionality of semiconductor devices increases, heterogeneously integrating modules that enable this additional functionality becomes an increasingly large factor in semiconductor manufacturing. Integrated modules may include and are not limited to memory, sensors, logic, antennas, display drivers, controllable drivers and the like. In this context, an integrated module may be a separately manufactured semiconductor product that is placed on a substrate or a design that is fabricated to the substrate by a separate process.

When patterning a design, or placing an integrated module, on a substrate, each substrate may be subject to conditions that may cause misplacement, mis-sizing, or other dispositioning, changing a connection path between the integrated module and the design being patterned. Conventionally, changed connection paths are provided by one or more correction masks that are fabricated to adjust connections based on a fixed set of potential dispositioning. However, the set of correction masks is typically limited and may not cover all possible corrections. Limitations resulting from a limited set of correction masks are further exacerbated by the ever-increasing number of nodes placed in a single chip package. With increasing node density, increasingly localized and precise corrections are required that can exceed the ability of a limited number of correction masks to correct.

What is needed are systems and method to mitigate the shortcomings of prior approaches.

SUMMARY

Systems and methods disclosed are generally related to masklessly developing connections between a chip-group and a design connection point on a substrate. In this context, a chip-group is separately manufactured semiconductor product that is placed on a substrate or a design that is fabricated to the substrate by a separate process. In placement of the chip-group on the substrate, whether physically placed or separately fabricated, according to certain embodiments the chip-group may be misplaced, mis-sized, or otherwise dispositioned relative to an expected position per a substrate layout design, causing a connection misalignment with the design connection point. According to certain embodiments, a machine learning (ML) model is trained on historical and simulated pixel models of chip-group connections and design connection points. Upon determining the chip-group misalignment by a metrology measurement, the trained ML model determines a pixel model to connect the misaligned chip-group, and causes the pixel model to be exposed to a substrate with a digital lithography tool, thereby connecting the dispositioned chip-group to the design connection point.

In one embodiment a system is disclosed that includes a memory containing computer-readable instructions, a processor configured to read the computer-readable instructions. The computer-readable instructions cause the processor to receive a substrate layout design comprising a design connection point, receive chip-group layout design comprising metadata defining a chip-group comprising a chip-group connection point, and generate a digital exposure group based on the substrate layout design and the chip-group layout design. The computer-readable instructions further cause the processor to pattern a substrate with the design connection point and placing the chip-group based on the digital exposure group, measure a displacement of the chip-group that results in a displacement of the chip-group connection point relative to the design connection point, and determine, using a trained machine learning (ML) model, a transformed pixel model comprising a connection path from the design connection point to the chip-group connection point.

In another embodiment, a computer program product is disclosed that includes a non-transitory computer-readable storage medium having computer-readable program code embodied therewith. The computer-readable program code is executable by one or more processors to receive a substrate layout design comprising a design connection point, receive chip-group layout design comprising metadata defining a chip-group comprising a chip-group connection point, and generate a digital exposure group based on the substrate layout design and the chip-group layout design. The computer-readable program code is further executable by the one or more processors to pattern a substrate with the design connection point and placing the chip-group based on the digital exposure group, measure a displacement of the chip-group that results in a displacement of the chip-group connection point relative to the design connection point, and determine, using a trained machine learning (ML) model, a transformed pixel model comprising a connection path from the design connection point to the chip-group connection point.

In further embodiments, a method is disclosed that includes receiving a substrate layout design comprising a design connection point, receiving chip-group layout design comprising metadata defining a chip-group comprising a chip-group connection point, and generating a digital exposure group based on the substrate layout design and the chip-group layout design. The method further includes patterning a substrate with the design connection point and placing the chip-group based on the digital exposure group, measuring a displacement of the chip-group that results in a displacement of the chip-group connection point relative to the design connection point, and determining, using a trained machine learning (ML) model, a transformed pixel model comprising a connection path from the design connection point to the chip-group connection point.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7A depicts a substrate layout design, according to certain embodiments

FIG. 7B depicts a package layout design, according to certain embodiments.

FIG. 7C depicts a chip-group layout design, according to certain embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered an element or limitation of the appended claims except where explicitly recited in a claim(s).

Systems and methods disclosed are generally related to masklessly exposed connections between a chip-group and a design connection point on a substrate. In this context, a chip-group is separately manufactured semiconductor product that is placed on a substrate or a design that is fabricated to the substrate by a separate process. In placement of the chip-group on the substrate, whether physically placed or separately fabricated, according to certain embodiments the chip-group may be misplaced, mis-sized, or otherwise dispositioned, relative to an expected position per a substrate layout design, causing a connection misalignment with the design connection point. According to certain embodiments, a machine learning (ML) model is trained on historical and simulated pixel models of chip-group connections and design connection points. Upon determining the chip-group misalignment by a metrology measurement, the trained ML model determines a pixel model to connect the misaligned chip-group, and causes the pixel model corrected connection or connection segment to be exposed to a substrate with a digital lithography tool, thereby connecting the dispositioned chip-group to the design connection point.

Design needs for semiconductor devices such as integrated circuits, video displays, and other devices increasingly require separately fabricated components such as memories, processors, application specific logic, lens arrays, active quantum dots, color filters, light focusing sidewall mirrors, and other components for additional functionality. As these needs increase, the space on a given substrate to place these components requires ever-increasing precision of placement as available substrate space for corrections shrinks.

Figure 1:
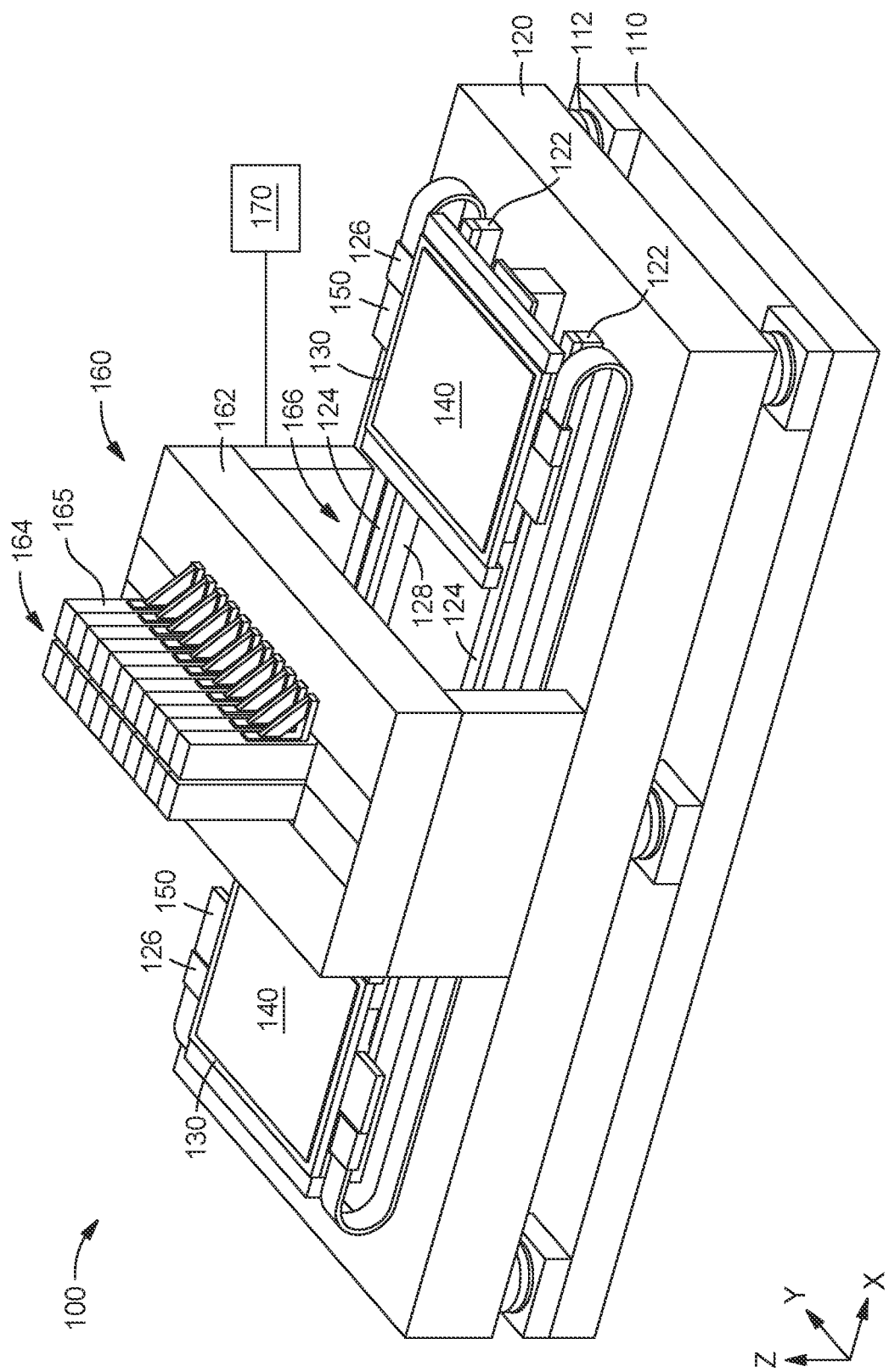
FIG. 1 is a perspective view of a system that may benefit from certain embodiments.

FIG. 1 is a perspective view of a system 100 that may benefit from certain embodiments. The system 100 is a digital lithography tool that includes a base frame 110, a slab 120, a stage 130, and a processing apparatus 160. The base frame 110 rests on the floor of a fabrication facility and may support the slab 120. Passive air isolators 112 are positioned between the base frame 110 and the slab 120. The slab 120 may be a monolithic piece of granite, and the stage 130 is disposed on the slab 120. A substrate 140 may be supported by the stage 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot positions the substrate 140 on the lift pins, and the lift pins thereafter gently lower the substrate 140 onto the stage 130.

The substrate 140 may, for example, be made of quartz and be used as part of a flat panel display, and processes utilizing substrates made of different materials (e.g., silicon, germanium, and other materials, and combinations of materials) for different purposes (e.g., integrated circuits (IC), application specific IC (ASIC), etc.) can benefit from the disclosure herein. In other embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 further includes a pair of supports 122 and a pair of tracks 124. The pair of supports 122 are disposed on the slab 120, and the slab 120 and the pair of supports 122 may be a single piece of material. The pair of tracks 124 are supported by the pair of the supports 122, and the stage 130 moves along the tracks 124 in the in-scan direction. In one embodiment, the pair of tracks 124 is a pair of parallel magnetic channels. As shown, each track 124 of the pair of tracks 124 is linear. In other embodiments, the track 124 may have a non-linear shape. An encoder 126 or other sensor is coupled to the stage 130 in order to provide location information to a controller 170, and may detect movement in a stage due to vibration. In some embodiments, encoder 126 may be an interferometer, or other device or sensor capable of detecting the location of a stage, vibration of a stage, and in-scan and/or cross-scan deviation of a stage due to vibration.

The processing apparatus 160 includes a support 162 and a processing unit 164. The support 162 is disposed on the slab 120 and may include an opening 166 for the stage 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems 301 (shown in FIG. 3) disposed in a case 165. The processing apparatus 160 may be utilized to perform maskless direct patterning. During operation, one of the stage 130 moves in the in-scan direction from a loading position, as shown in FIG. 1, to a processing position. The processing position may refer to one or more positions of the stage 130 as the stage 130 passes under the processing unit 164. During operation, the stage 130 is lifted by a plurality of air bearings 202 (shown in FIG. 2) and moves along the pair of tracks 124 from the loading position to the processing position. A plurality of vertical guide air bearings 202 (shown in FIG. 2) are coupled to the stage 130 and positioned adjacent an inner wall 128 of each support 122 in order to stabilize the movement of the stage 130. The stage 130 may also move in the cross-scan direction by moving along a track 150 for processing and/or indexing the substrate 140.

Figure 2:
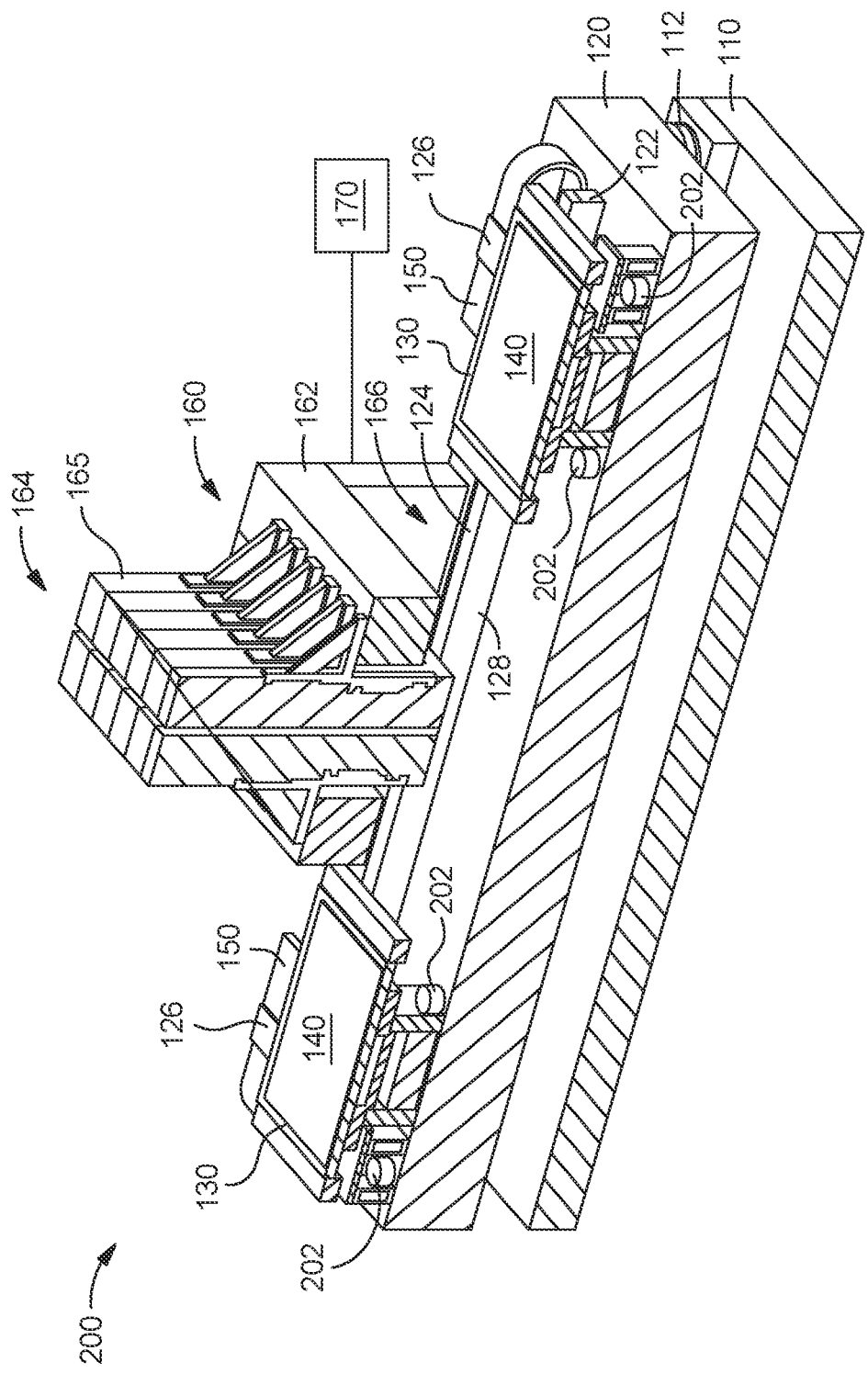
FIG. 2 is a cross-sectional side view of the system of FIG. 1, according to certain embodiments.

FIG. 2 is a cross-sectional side view 200 of the system 100 of FIG. 1 according to certain embodiments. As shown, the stage 130 includes a plurality of air bearings 202 for lifting the stage 130. Stage 130 may also include a motor coil (not shown) for moving the stage 130 along the tracks 124. The stage 130 and the processing apparatus 160 may be enclosed by an enclosure (not shown) in order to provide temperature and pressure control.

The system 100 also includes a controller 170. The controller is generally designed to facilitate the control and automation of the processing techniques described herein. The controller is coupled to or in communication with one or more of the processing apparatus 160, the stage 130, and the encoder 126. The processing apparatus 160 and the stage 130 provide information to the controller regarding the substrate processing and the substrate aligning. For example, the processing apparatus 160 may provide information to the controller to alert the controller that substrate processing has been completed. The encoder 126 may provide location information to the controller, and the location information is then used to control the stage 130 and the processing apparatus 160.

The controller may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position.

Figure 3:
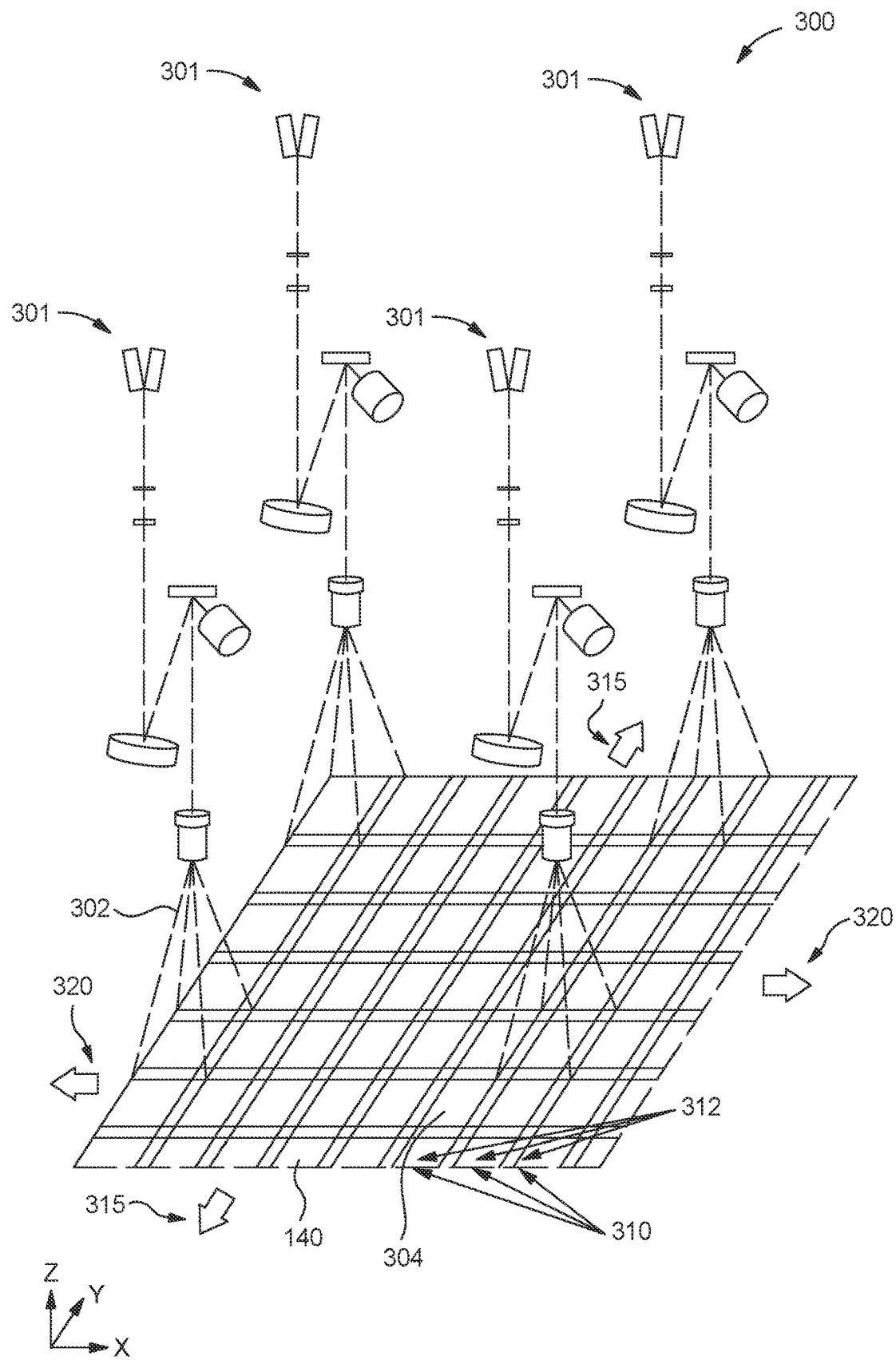
FIG. 3 is a perspective schematic view of a plurality of image projection systems according to certain embodiments.

FIG. 3 is a perspective schematic view 300 of a plurality of image projection systems 301 according to certain embodiments. As shown in FIG. 3, each image projection system 301 produces a plurality of write beams 302 onto a surface 304 of the substrate 140, corresponding to a plurality of processing positions 312, along a plurality of tracks 310, each of the tracks 310 to be scanned by one or more of the write beams 302. The movement of the substrate 140 is in an in-scan direction indicated by arrow 315, while the cross-scan direction is indicated by arrow 320. As the substrate 140 moves in the in-scan direction and cross-scan direction, the entire surface 304 may be patterned by the write beams 302. The number of the image projection systems 301 may vary based on the size of the substrate 140 and/or the speed of stage 130. In one embodiment, there are 22 image projection systems 301 in the processing apparatus 160.

Figure 4:
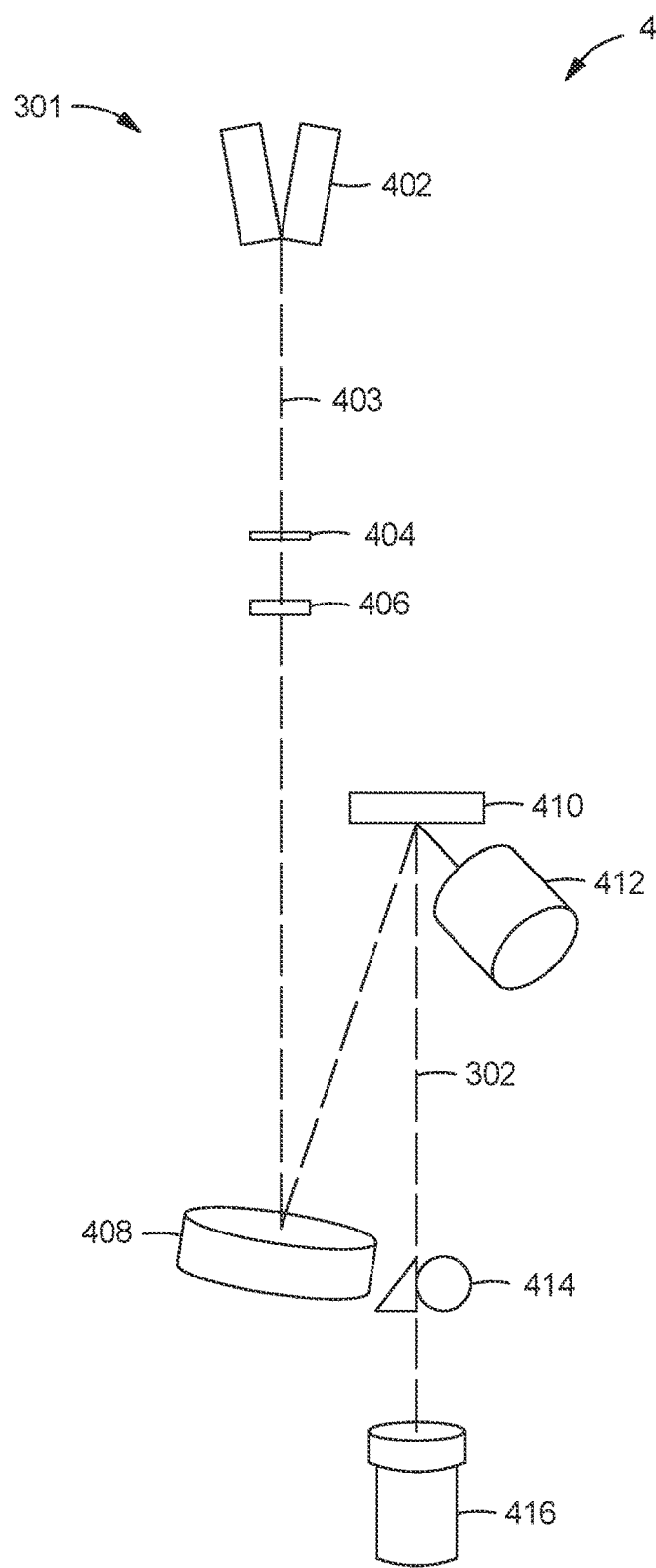
FIG. 4 is a perspective schematic view of one image projection system of the plurality of image projection systems of FIG. 3, according to certain embodiments.

FIG. 4 is a perspective schematic view 400 of one image projection system 301 of the plurality of image projection systems 301 of FIG. 3 according to certain embodiments.

The image projection system 301 includes a spatial light modulator (SLM) 410 and projection optics 416. The components of the image projection system 301 vary depending on the SLM 410 being used. The SLM 410 includes, but is not limited to, an array of microLED's, VCSEL's, liquid crystal displays (LCDs), or any solid-state emitter of electromagnetic radiation, and a digital mirror device (DMD). The SLM 410 includes a plurality of spatial light modulator pixels. Each SLM pixel of the plurality of SLM pixels are individually controllable and are configured to project a write beam corresponding to a pixel of the plurality of pixels (e.g., shown in FIGS. 5, 6, 7, and others). The compilation of plurality of pixels form the pattern written into the photoresist, referred to herein as the mask pattern. The projection optics 416 includes projection lenses, for example, 10× objective lenses, used to project the light onto the substrate 140. In operation, based on the mask pattern data provided to the SLM 410 by the controller 170, each SLM pixel of the plurality of SLM pixels is at an "on" position or "off" position. Each SLM pixel at an "on" position forms a write beam that the projection optics 416 then projects the write beam to the photoresist layer surface of the substrate 140 to form a pixel of the mask pattern.

In one embodiment, spatial light modulator 410 is a DMD. The image projection system 301 includes a light source 402, an aperture 404, a lens 406, a frustrated prism assembly 408, the SLM 410, and the projection optics 416. In this embodiment, the SLM 410 includes a plurality of mirrors, e.g., the plurality of spatial light modulator pixels. Each mirror of the plurality of mirrors corresponds to a pixel that may correspond to a pixel of the mask pattern. In some embodiments, the DMD includes more than about 4,000,000 mirrors, while in other embodiments may include 1920× 1080 mirrors, which represent the number of pixels of a high definition television. The light source 402 is any suitable light source, such as a light emitting diode (LED) or a laser, capable of producing a light having a predetermined wavelength. In one embodiment, the predetermined wavelength is in the blue or near ultraviolet (UV) range, such as less than about 450 nm. The frustrated prism assembly 408 includes a plurality of reflective surfaces. In operation, a light beam 403 having is produced by the light source 402. The light beam 403 is reflected to the DMD by the frustrated prism assembly 408. When the light beam 403 reaches the mirrors of the DMD, each mirror at "on" position reflect the light beam 403, i.e., forms a write beam, also known as a "shot", that the projection optics 416 then projects to shot the photoresist layer surface of the substrate 140. The plurality of write beams 302, also known as a plurality of shots, forms a plurality of pixels of the mask pattern.

Figure 5:
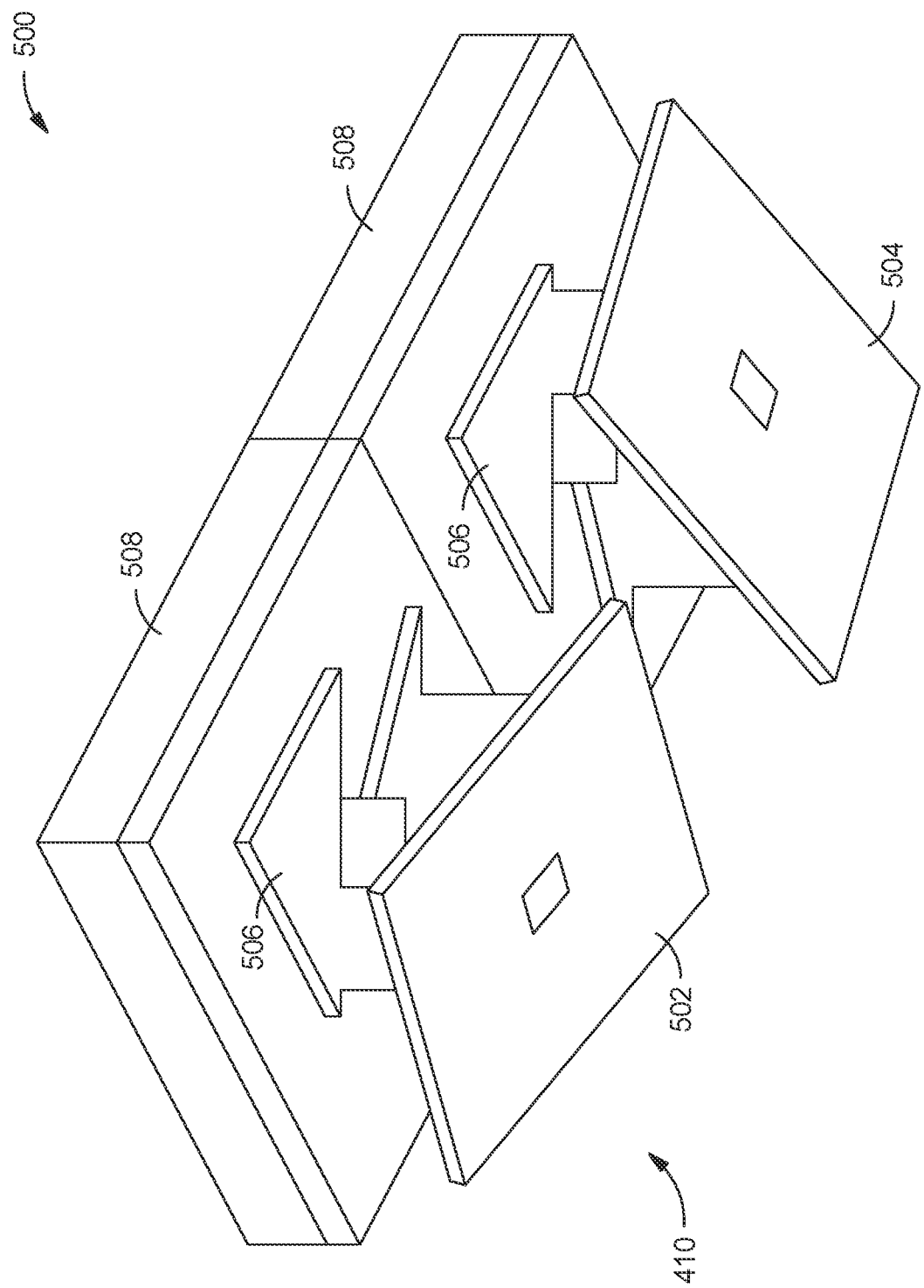
FIG. 5 is an enlarged perspective view of two pixel elements of the SLM, according to certain embodiments.

FIG. 5 is an enlarged perspective view 500 of two pixel elements 502, 504 of the SLM 410 according to certain embodiments. In the embodiment in which the SLM 410 is a DMD, the pixel elements may be mirrors. As shown, each pixel element 502, 504 is disposed on a tilting mechanism 506, which is disposed on a memory cell 508. The memory cell 508 may be a CMOS SRAM. During operation, each pixel element 502, 504 is controlled by loading the mask data into the memory cell 508. The mask data electrostatically controls the tilting of the pixel element 502, 504 in a binary fashion. When the pixel element 502, 504 is in reset mode or no power is applied, the pixel element 502, 504 is in a flat position not corresponding to any binary position. Zero (0) in binary may correspond to "off" position, which means the pixel element is tilted at −10 degrees, −12 degrees, or any other feasible tilt in the negative direction. One (1) in binary may correspond to "on" position, which means the pixel element is tilted at +10 degrees, +12 degrees, or any other feasible tilt in the positive direction. As shown in FIG. 5, the pixel element 502 is at "off" position and the pixel element 504 is at "on" position.

Figure 6:
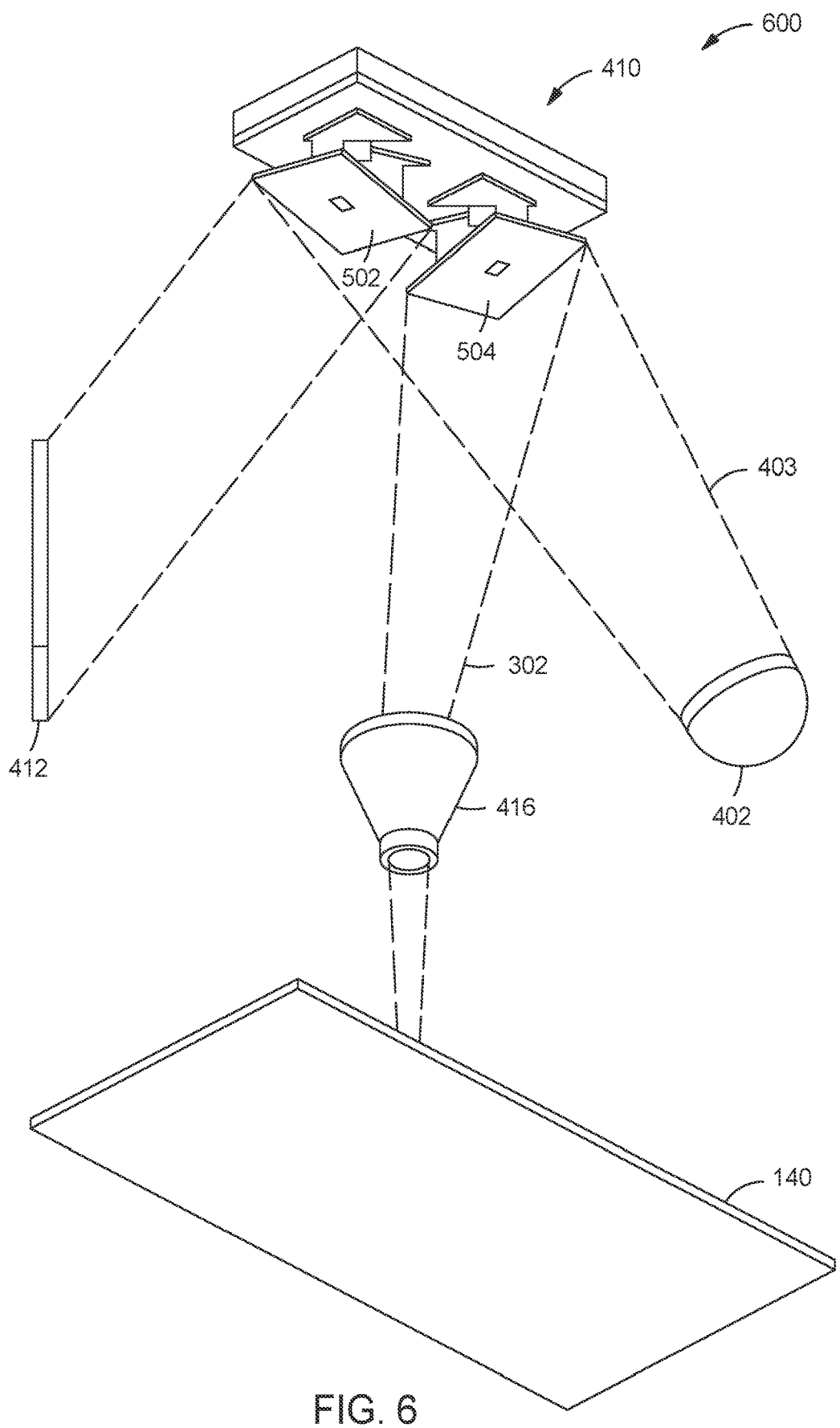
FIG. 6 depicts a schematic view of beam being reflected by the two pixel elements of the SLM of FIG. 5, according to certain embodiments.

FIG. 6 depicts a schematic view 600 of beam 403 being reflected by the two pixel elements 502, 504 of the SLM 410 of FIG. 5 according to certain embodiments. As shown, the pixel element 502, which is at "off" position, reflects the beam 403 generated from the light source 402 to the light dump 412. The pixel element 504, which is at "on" position, forms the write beam 302 by reflecting the beam 403 to the projection optics 416, which in turn projects the beam 403 to the substrate 140.

FIG. 7A depicts a substrate layout design 700A, according to certain embodiments. In this context, a layout design may be a layout of design elements to be patterned on the substrate 140, developed by a designer, programmatically, or a combination of both. Although the depicted example design shows a single layer, one of skill in the art will appreciated that a typical design may include more than one layer, for patterning on the substrate 140. Substrate layout design 700A is provided to system 100 for patterning on the substrate 140, and includes a variety of features, limited only by the design required to meet one or more customer requirements. Such features may include one or more design elements 704 that may be connection lines, logic, transistors, vias from other layers, having a design connection point 708 for patterning on the substrate 140. Design connection point 708, according to certain embodiments may be positioned to be connected via pixel model 710 to another design connection point, or to a package 712, and/or to a chip-group 716 at chip-group connection point 728. Although shown as a points, both design connection point 708 and chip-group connection point 728 may include both a point, and a line extending from the point, as discussed below in connection with FIGS. 10C and 10D. Package 712 includes collections of one or more chip-groups such as chip-group 716 according to certain embodiments. Chip-group 716 may be a pre-assembled/fabricated element that may be placed on substrate 140 during manufacturing and in some embodiments may be fabricated separately on substrate 140 from design element 704. According to certain embodiments, chip-group 716 may include functional elements that provide functionality as part of the substrate layout design 700A, and may include functional elements such as memories, processors, application specific logic, lens arrays, active quantum dots, color filters, light focusing sidewall mirrors, and other components for additional functionality. In the example substrate layout design 700A depicted, drive chiplet 720 and memory chip-group 724 are further examples of chip-groups according to certain embodiments.

FIG. 7B depicts a package layout design 700B, according to certain embodiments. Package layout design 700B includes a layout design for the package 712, according to certain embodiments. In this context, a layout design may be a layout of design elements to be patterned on the substrate 140, developed by a designer, programmatically, or a combination of both.

FIG. 7C depicts a chip-group layout design 700C, according to certain embodiments. Chip-group layout design 700C includes a layout design for the chip-group 716 one or more chip-group connection points 728 positioned on the chip-group. In this context, a layout design may be a layout of design elements to be patterned on the substrate 140, developed by a designer, programmatically, or a combination of both. According to certain embodiments, chip-group layout design 700C includes metadata defining the chip-group including relative positions of one or more chip-group connection points 728.

Figure 8:
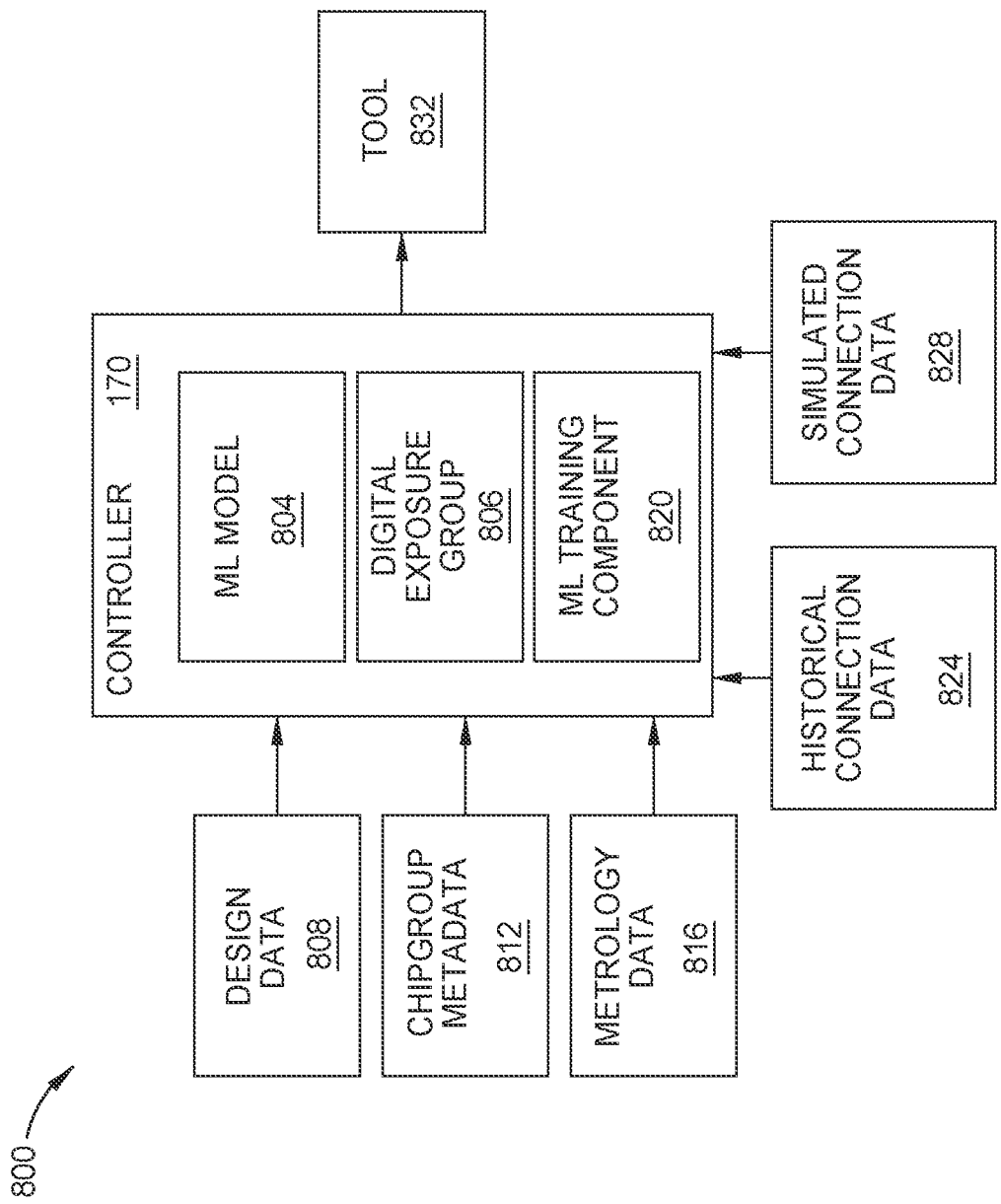
FIG. 8 depicts a schematic diagram of the controller according to certain embodiments.

FIG. 8 depicts a schematic diagram 800 of the controller 170 according to certain embodiments. Although controller 170 has been described as a unitary item, it may be a single integrated circuit designed to functionality according to certain embodiments, a processor coupled to one or more memories, a standalone computing system, a group of computing systems coupled together, a distributed computing system, or a combination of these.

In addition to including functions for controlling and operating the digital lithography tool of system 100, controller 170 includes a machine learning (ML) model 804. When chip-group layout design 700C is patterned on substrate 140, according to certain embodiments the chip-group 716 may be dispositioned as described below in connection with FIG. 10. As a result, a pixel model 710 of the connection between the chip-group connection point 728 of the patterned chip-group 716 is not in a position relative to a design connection point 708, or a connection point of another chip-group, as set forth in the substrate layout design 700A. If pixel model 710 is patterned onto the substrate 140, a proper electrical connection may not be formed between the chip-group connection point 728 and design connection point 708. According to disclosed embodiments, metrology data is developed for the dispositioned chip-group is detected by scanning the substrate 140 with a metrology tool (not shown), or through modeling the chip-group.

According to disclosed embodiments, ML model 804 takes substrate layout design 700A, chip-group layout design 700C, metrology data (e.g., the actual placement of the chip-group 716 on the substrate 140, and pixel model 710, and generates a transformed pixel model (discussed below in connection with FIG. 10) for patterning on the substrate, to make the proper electrical connection. According to certain embodiments, the transformed pixel model is provided to the system 100 for optical imaging of the transformed pixel model onto the substrate 140. According to certain embodiments, ML model 804 is a component of a larger system or process for generating a transformed pixel model. In these embodiments, some or all of the transformed pixel model generated by ML model 804 is utilized. In some embodiments, a modified pixel model is selected by a table lookup based on known disposition (e.g., a known offset) offsets as between components on the substrate 140. In these embodiments, the table lookup determines the modified pixel model to select from a library of modified pixel models configured to address known offsets between design elements. In some embodiments, modified pixel model is combined with the transformed pixel model generated by ML model 804. In some embodiments where the correction needed is known, this data is provided to the ML model 804 for the generation of the transformed pixel model. Alternatively, a transformed pixel model generated by the ML model 804 is further modified based on the known disposition offset.

Because the transformed pixel model provides the correct connection path between a dispositioned chip-group and a design connection point, to address specific chip-group dispositioning, no additional correction is needed according to certain embodiments. For example, a collection of correction masks is not needed for patterning the transformed pixel model because the transformed pixel model is generated for each particular dispositioning.

Although embodiments described herein contemplate generating a transformed pixel model for connecting a dispositioned chip-group to a design connection point, one of skill in the art will appreciate that other types of dispositioning may be addressed according to other embodiments. For example, if two design connection points on a substrate are not patterned as defined by a substrate design layout, due to factors such as vibration, humidity, particle contamination, SLM skew, etc., techniques described herein may be beneficially employed develop transformed pixel models that addresses this dispositioning. Moreover, relative dispositioning between chip-groups may be addressed by techniques described herein.

According to certain embodiments, ML model 804 may be a supervised or unsupervised machine learning. According to certain embodiments, ML model 804 is a classifier, such as a neural network, a deep learning neural network, k-means classifier, random forest walk, or the like, capable of receiving an input, for example of metrology data of a substrate such as substrate 140, processed by a digital lithography tool such as system 100, and classify a dispositioning between components on the substrate. By way of example and not limitation, ML model 804 may receive as inputs substrate layout design 700A, metrology data regarding one or more dispositioned elements of substrate layout design 700A, and a pixel model for connecting a dispositioned element to another element of the substrate layout design 700A, to classify the dispositioning and as a result of the classification, determined a transformed pixel model to address the dispositioning (e.g., generate a path to electrically couple the dispositioned element to the other element).

Controller 170 receives design data 808 that includes substrate layout design 700A data, package design 700B data, and chip-group design 700C data, and generates a digital exposure group 806. Chip-group Design data 808 might include or accompanied by chip-group metadata 812 that includes information about the placements of the chip-group design cell instances on the substrate layout design and the connections or connection segments that needs to be transformed with ML model. Digital exposure group 806 is provided to a tool 832 that according to certain embodiments may be the digital lithography tool of system 100 for patterning on substrate 140.

ML model 804 receives design data 808 and associated chip-group metadata 812. ML model 804 further receives metrology data 816 generated by a metrology tool (not shown) that measures metrology of the substrate 140 patterned with substrate layout design 700A or generated by simulating this metrology.

Controller further includes ML training component 820 for training ML model 804. ML training component 820 may receive historical connection data 824, simulated connection data 828, or both, to train ML model 804. Historical connection data 824 and simulated connection data 828 in this context may be pixel models of connections between chip-group connection points and design connection points, connections between two (or more) design connection points, or connections between two (or more) chip-group connection points, in which one or connection both points were dispositioned or otherwise dispositioned. For historical data, historical connection data 824 may comprise historical pixel model data from previously measured patterned substrates (e.g., metrology data) that are indicated as dispositioned or dispositioned. Simulated connection data 828 may include simulated pixel model data such as paths between connection points that are simulated as dispositioned or dispositioned. According to certain embodiments, ML model 804 is trained offline, or at a time before processing using system 100 is undertaken, while in other embodiments, training may occur as system 100 is processing substrates.

ML training component 820 employs the historical connection data 824 and/or simulated connection data 828 to train ML model 804. Once trained, ML model 804 may receive data as described above to generate the transformed pixel model to the tool 832, such as the digital lithography tool of system 100.

Figure 9:
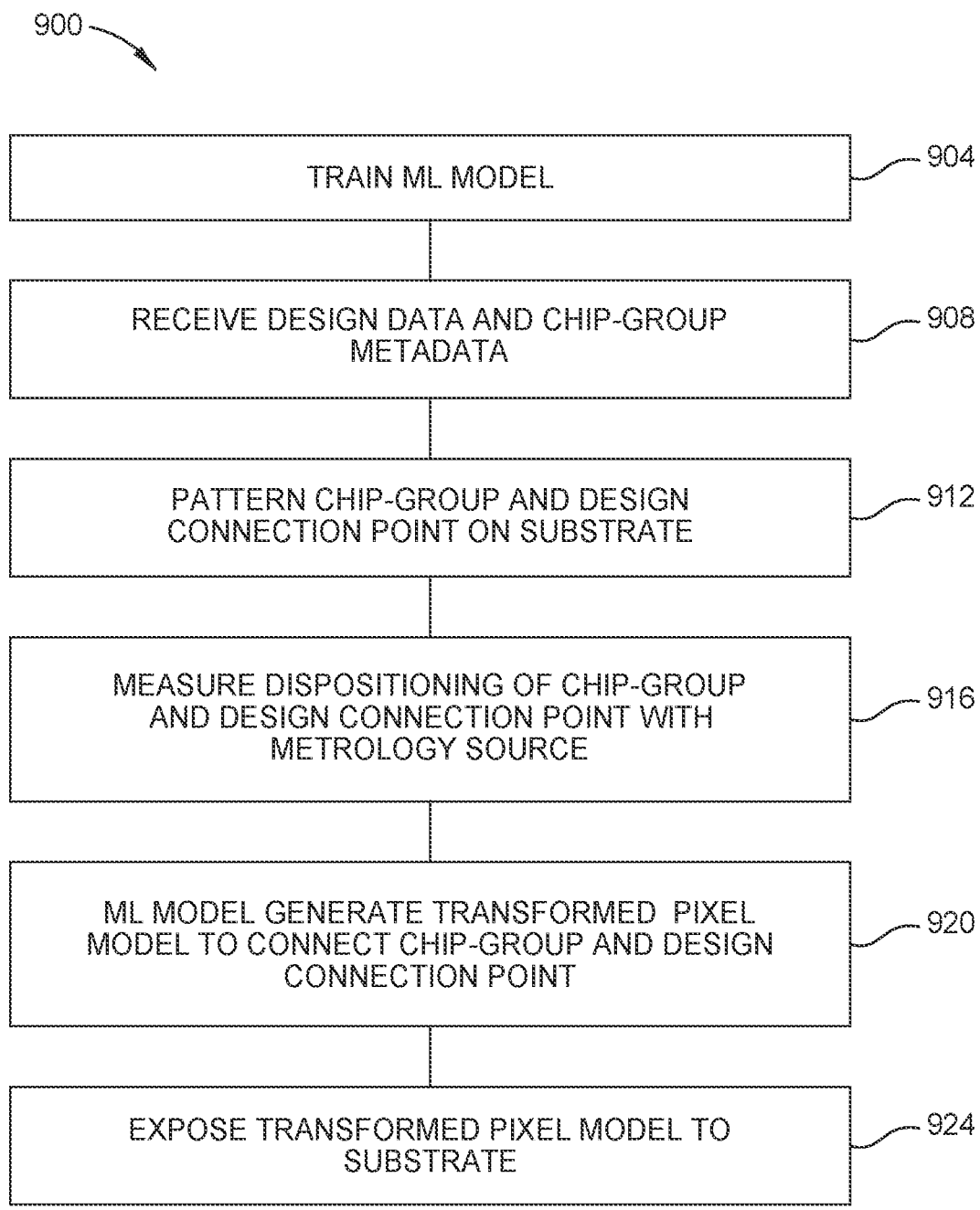
FIG. 9 depicts a flow diagram for correcting locally dispositioned patterns by ML based dynamic digital corrections, according to certain embodiments.

FIG. 9 depicts a flow diagram 900 for correcting locally dispositioned patterns by ML based dynamic digital corrections, according to certain embodiments. At block 904 ML model 804 is trained by ML training component 820. At block 908, design data and chip-group metadata are received by the controller 170 of a digital lithography tool such as system 100.

At block 912, a chip-group 716 that includes a chip-group connection point 728, and a design connection point 708 of substrate layout design 700A are patterned to substrate 140. After patterning these to the substrate 140, metrology data is developed for the patterned substrate from a metrology source, by scanning the substrate 140 with a metrology tool and/or simulating metrology measurements. Measurements of displacement of chip-group 716 relative to design connection point 708 patterned on the substrate are developed by the metrology source at block 916.

At block 920, the design data, chip-group metadata, and displacement data are provided to the ML model that classifies the path needed to electrically couple chip-group connection point 728 to the design connection point 708. Upon classification, ML model 804 transforms pixel model 710 of the substrate layout design 700A to a transformed pixel model to make the electrical coupling. According to certain embodiments, the actions of block 920 may be carried out in real time during processing of a substrate.

At block 924, the controller 170 provides the transformed pixel model to the digital lithography tool of system 100 for exposure of the transformed pixel model to the substrate 140. According to certain embodiments, the actions of block 924 may be carried out in real time during processing of a substrate.

Figure 10B:
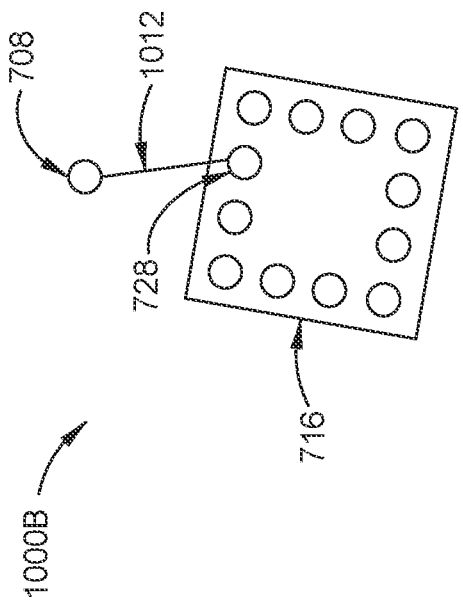
FIG. 10B depicts a schematic diagram of a dispositioned chip-group connected to a design connection point by a transformed pixel model, according to certain embodiments.
Figure 10D:
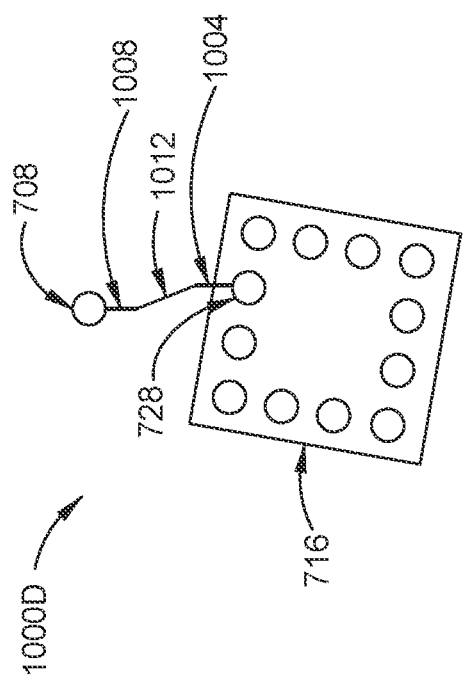
FIG. 10D depicts a schematic diagram of a dispositioned chip-group connected to a design connection point by a transformed pixel model, according to certain embodiments.
Figure 10A:
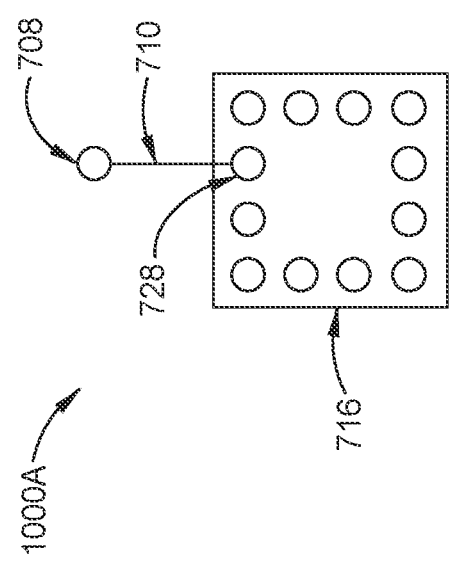
FIG. 10A depicts a schematic diagram of a chip-group depicted by a layout design, according to certain embodiments.

FIG. 10A depicts a schematic diagram 1000A of a chip-group 716 depicted by a layout design, according to certain embodiments.

FIG. 10B depicts a schematic diagram 1000B of a dispositioned chip-group 716 connected to a design connection point 708 by a transformed pixel model 1012, according to certain embodiments. As shown chip-group 716 is dispositioned (e.g., rotated), in a manner that is different than is depicted in a substrate layout design. Upon detecting this dispositioning by a metrology tool (or simulated metrology) the dispositioning data, in addition to other data as described above, is provided to the ML model 804 that has been trained by ML training component 820. ML model 804 generates transformed pixel model 1012 to make the connection between chip-group connection point 728 and design connection point 708.

Figure 10C:
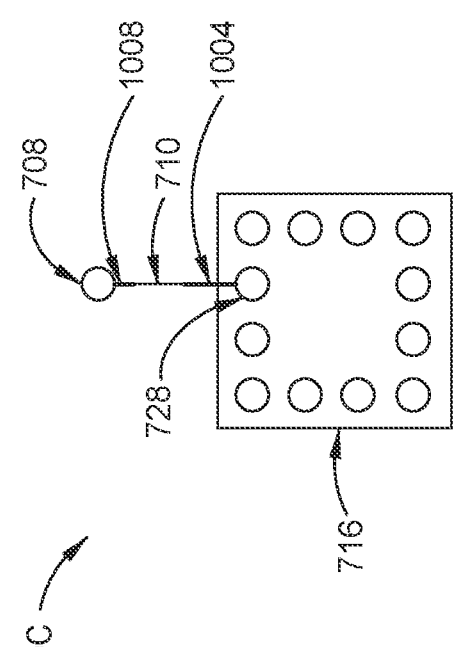
FIG. 10C depicts a schematic diagram of a chip-group depicted by a layout design, according to certain embodiments.

FIG. 10C depicts a schematic diagram 1000C of a chip-group 716 depicted by a layout design, according to certain embodiments. In the disclosed embodiments, a chip-group connection line 1004 may extend from of the chip-group connection point 728, and a design point connection line 1008 may extend from the design connection point 708, with the pixel model 710 completing the connection between the chip-group connection line 1004 and the design point connection line 1008.

FIG. 10D depicts a schematic diagram 1000D of a dispositioned chip-group 716 connected to a design connection point 708 by a transformed pixel model 1012, according to certain embodiments. In these embodiments, transformed pixel model 1012 is generated to connect the chip-group connection line 1004 and the design point connection line 1008 when the chip-group 716 is dispositioned.

Although dispositioning is shown in this example as rotation, other types of displacement of chip-group 716 may utilize the techniques described herein to generate and then implement an electrical connection between chip-group connection point 728 and design connection point 708. Dispositioning in this context may, in addition to rotation, may include shifting laterally, longitudinally, or both, as well as mis-sizing. There might be also sizing change of the chip-group that can cause positional displacement of the connection point.

Figure 11:
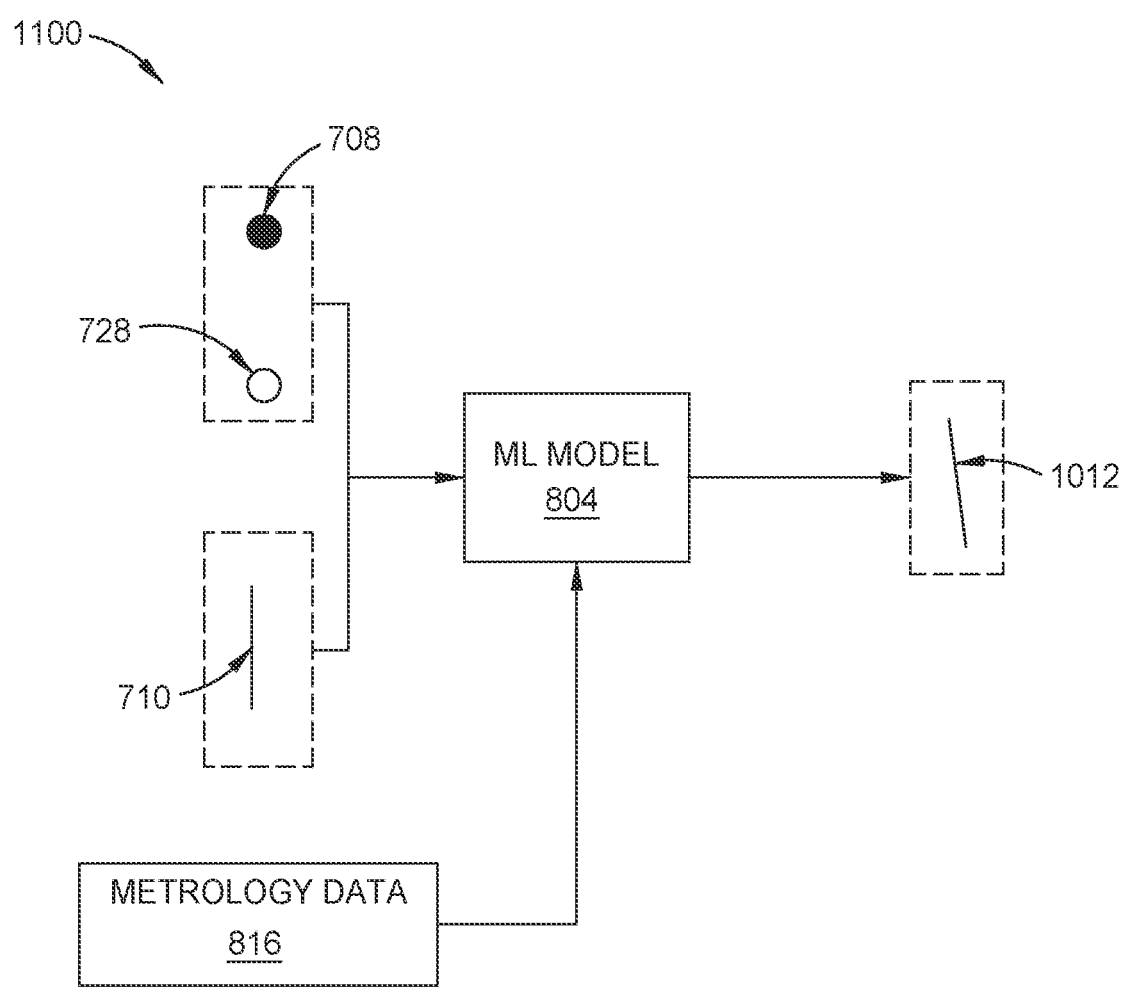
FIG. 11 depicts a schematic diagram for a machine learning (ML) model, according to certain embodiments.

FIG. 11 depicts a schematic diagram 1100 for a machine learning (ML) model 804, according to certain embodiments. After training by ML training component 820, ML model 804 receives design connection point 708, chip-group connection point 728, and pixel model 710 of the connection from substrate layout design 700A. The connection pixel model can also be generated during the process from corresponding metadata. In this case, the geometric definition of the connections are first transformed to pixel models first. ML model 804 determines an offset (e.g., misplacement, rotation, mis-sizing, or other dispositioning) between design connection point 708 and chip-group connection point 728 patterned on the substrate 140 with metrology data 816. ML model 804, using the received data, transforms pixel model 710 to transformed pixel model 1012 to that is provided to controller 170, to cause the digital lithography tool of system 100 to pattern the transformed pixel model 1012 to the substrate 140, to electrically couple the design connection point 708 and the chip-group connection point 728.

Figure 12:
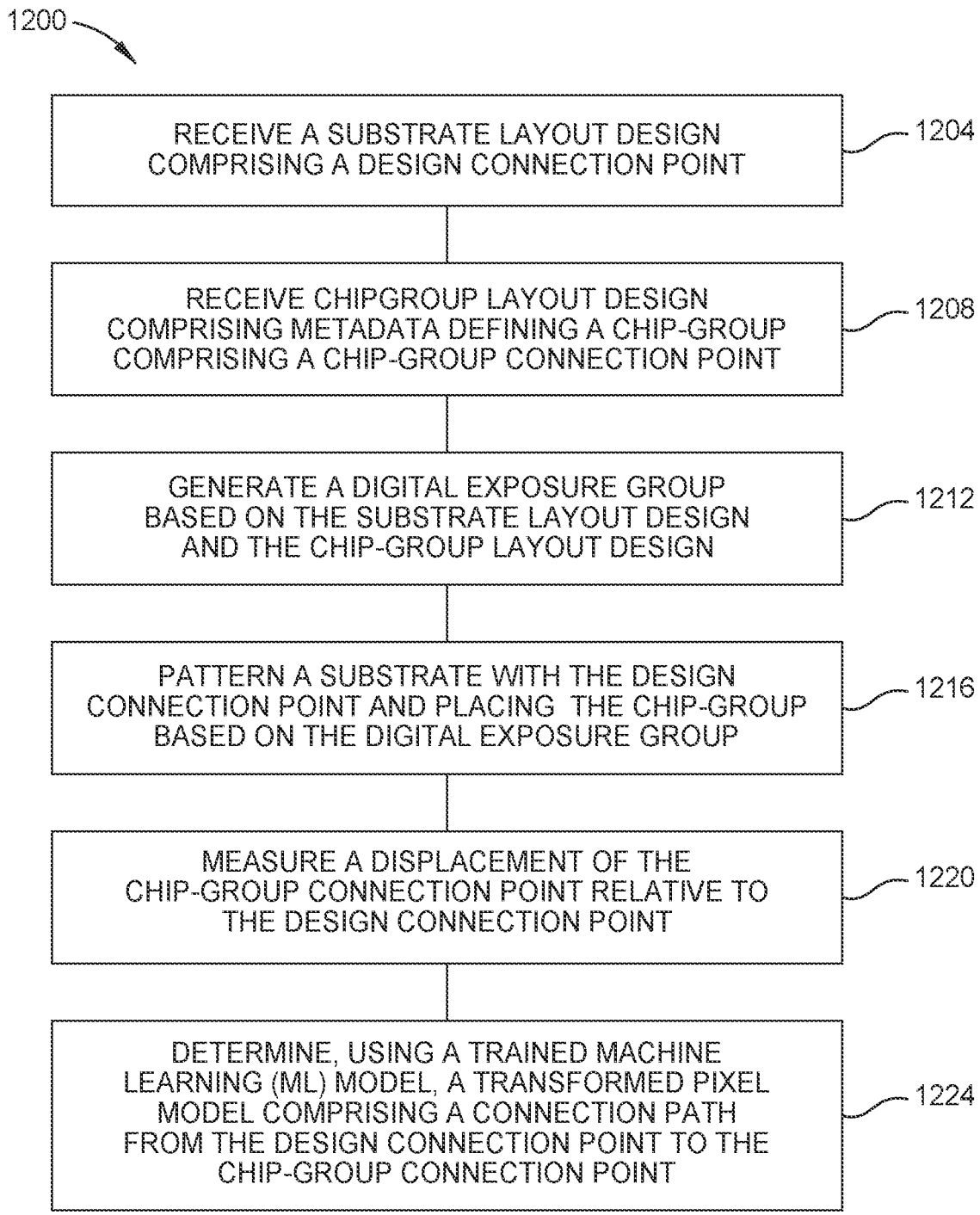
FIG. 12 depicts a method for correcting locally dispositioned patterns by ML based dynamic digital corrections, according to certain embodiments.

FIG. 12 depicts a method 1200 for correcting locally dispositioned patterns by ML based dynamic digital corrections, according to certain embodiments. At block 1204 the controller 170 receives a substrate layout design 700A comprising a design connection point 708.

At block 1208, the controller 170 receives chip-group layout design 700C comprising metadata defining a chip-group comprising a chip-group connection point 728.

At block 1212 the controller generates the digital exposure group 806 based on the substrate layout design 700A and the chip-group layout design 700C.

At block 1216, the system 100 patterns a substrate 140 with the design connection point 708 and placing the chip-group connection point 728 based on the digital exposure group 806.

At block 1220 the ML model 804 measures a displacement of the chip-group connection point 728 relative to the design connection point 708.

At block 1224 the ML model 804 determines, a transformed pixel model 1012 comprising a connection path from the design connection point 708 point to the chip-group connection point 728. According to certain embodiments, the controller 170 causes the system 100 to optically expose the transformed pixel model to the substrate, electrically coupling the chip-group connection point to the design connection point. According to certain embodiments, the ML model is trained with a plurality of training pixel models, each training pixel model defining a path between a training design connection point and a training chip-group connection point of a training substrate design layer.

Figure 13:
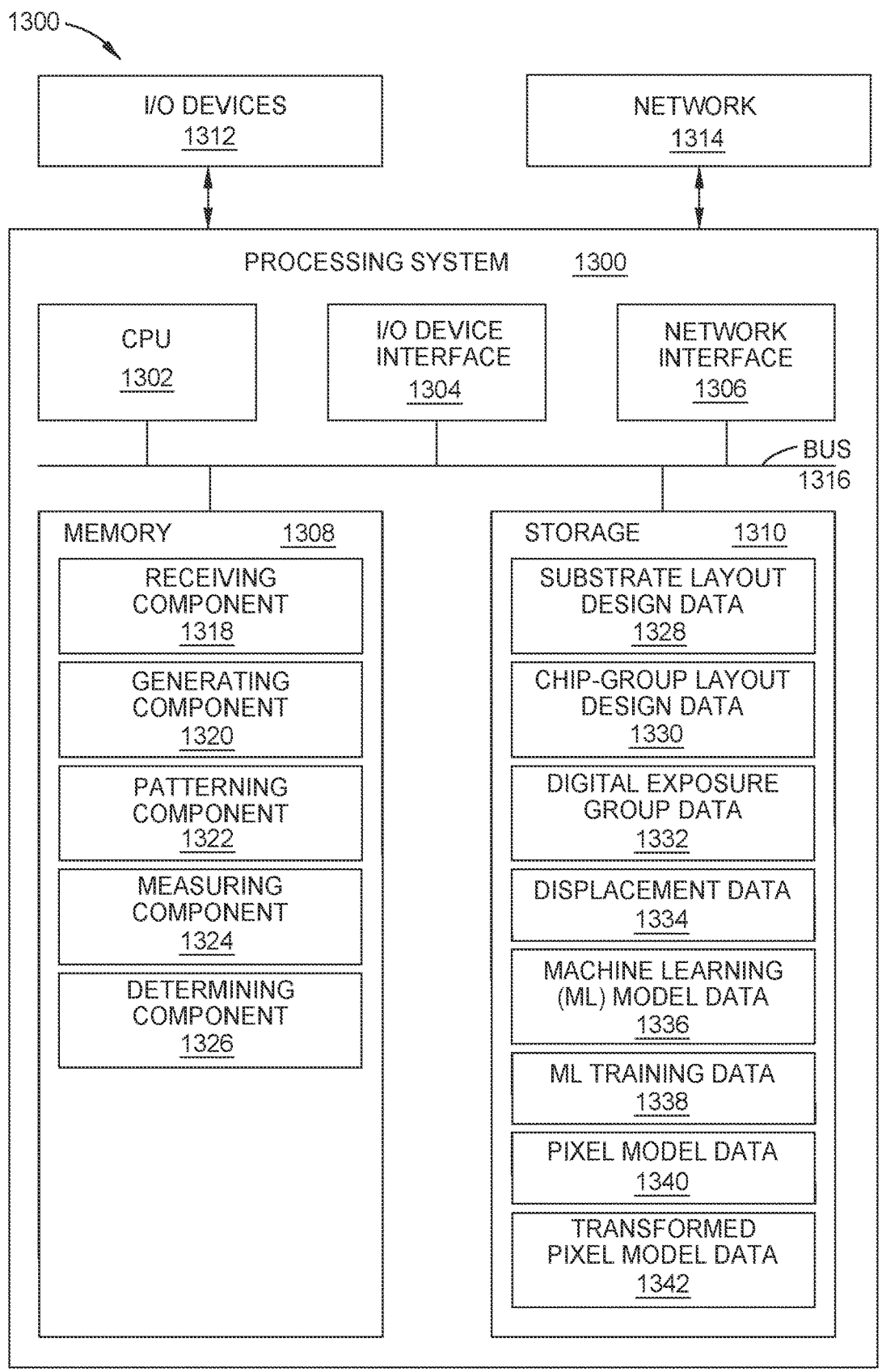
FIG. 13 depicts a processing system, according to certain embodiments.

FIG. 13 depicts a processing system 1300, according to certain embodiments. Processing system 1300 is an example of controller 170, according to certain embodiments, and may be used in place of controller 170 described above. FIG. 13 depicts an example processing system 1300 that may operate embodiments systems described herein to perform embodiments according to the flow diagrams and methods described herein, such as the method for correcting locally dispositioned patterns by dynamic digital corrections described with respect to FIGS. 1-12.

Processing system 1300 includes a central processing unit (CPU) 1302 connected to a data bus 1316. CPU 1302 is configured to process computer-executable instructions, e.g., stored in memory 1308 or storage 1310, and to cause the processing system 1300 to perform embodiments of methods described herein on embodiments of systems described herein, for example with respect to FIGS. 1-12. CPU 1302 is included to be representative of a single CPU, multiple CPUs, a single CPU having multiple processing cores, and other forms of processing architecture capable of executing computer-executable instructions.

Processing system 1300 further includes input/output (I/O) device(s) 1312 and interfaces 1304, which allows processing system 1300 to interface with input/output devices 1312, such as, for example, keyboards, displays, mouse devices, pen input, and other devices that allow for interaction with processing system 1300. Note that processing system 1300 may connect with external I/O devices through physical and wireless connections (e.g., an external display device).

Processing system 1300 further includes a network 1314 interface, which provides processing system with access to external network 1314 and thereby external computing devices.

Processing system 1300 further includes memory 1308, which in this example includes a receiving component 1318, generating component 1320, patterning component 1322, measuring component 1324, and determining component 1326 for performing operations described herein, for example as described in connection with FIG. 12.

Note that while shown as a single memory 1308 in FIG. 13 for simplicity, the various aspects stored in memory 1308 may be stored in different physical memories, including memories remote from processing system 1300, but all accessible by CPU 1302 via internal data connections such as bus 1316.

Storage 1310 further includes substrate layout design data 1328, chip-group layout design data 1330, digital exposure group data 1332, displacement data 1334, machine learning (ML) model data 1336, ML training data 1338, pixel model data 1340, and transformed pixel model data 1342, for performing operations described herein. As would be appreciated by one of ordinary skill, other data and aspects may be included in storage 1310.

As with memory 1308, a single storage 1310 is depicted in FIG. 13 for simplicity, but various aspects stored in storage 1310 may be stored in different physical storages, but all accessible to CPU 1302 via internal data connections, such as bus 1316, or external connection, such as network interfaces 1306. One of skill in the art will appreciate that one or more elements of processing system 1300 may be located remotely and accessed via a network 1314.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more operations or actions for achieving the methods. The method operations and/or actions may be interchanged with one another without departing from the scope of the claims. In other words, unless a specific order of operations or actions is specified, the order and/or use of specific operations and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:
1. A system comprising:
a memory containing computer-readable instructions; and one or more processors configured to read the computer-readable instructions, that cause the one or more processors to:
receive design data and chip-group metadata;
pattern a chip-group including a chip-group connection point and a design connection point of a substrate layout design with a lithography tool;
measure the chip-group relative to the design connection point to obtain displacement data;
provide the design data, the chip-group metadata, and the displacement data to a machine learning (ML) model;
transform a pixel model of the substrate layout design to a transformed pixel model to make an electrical coupling; and
provide the transformed pixel model to the lithography tool for exposure of the transformed pixel model.

2. The system of claim 1, wherein the ML model is trained by a training component.

3. The system of claim 2, wherein the computer-readable instructions further cause the one or more processors to:
operate the ML model; and
train the ML model with a plurality of training pixel models, each training pixel model defining a path between a training design connection point and a training chip-group connection point of a training substrate design layer.

4. The system of claim 3, wherein the plurality of training pixel models is based on one or more of historical pixel model data or simulated pixel model data.

5. The system of claim 4, wherein the ML model comprises one of a supervised or unsupervised Model, configured as a classification model.

6. The system of claim 1, wherein the computer-readable instructions further cause the processor to determine whether a measured displacement of the chip-group connection point relative to the design connection point is different than a placement of the chip-group connection, based on the substrate layout design.

7. The system of claim 6, wherein measuring a displacement of the chip-group comprises measuring placement of the chip-group with one of a metrology tool or a simulation.

8. A computer program product comprising:
a non-transitory computer-readable storage medium having computer-readable program code embodied therewith, the computer-readable program code being executable by one or more processors to:
receive design data and chip-group metadata;
pattern a chip-group including a chip-group connection point and a design connection point of a substrate layout design with a lithography tool;
measure the chip-group relative to the design connection point to obtain displacement data;
provide the design data, the chip-group metadata, and the displacement data to a machine learning (ML) model;
transform a pixel model of the substrate layout design to a transformed pixel model to make an electrical coupling; and
provide the transformed pixel model to the lithography tool for exposure of the transformed pixel model.

9. The computer program product of claim 8, wherein the ML model is trained by a training component.

10. The computer program product of claim 9, wherein the computer-readable instructions further cause the one or more processors to:
operate the ML model; and
train the ML model with a plurality of training pixel models, each training pixel model defining a path between a training design connection point and a training chip-group connection point of a training substrate design layer.

11. The computer program product of claim 10, wherein the plurality of training pixel models is based on one or more of historical pixel model data or simulated pixel model data.

12. The computer program product of claim 11, wherein the ML model comprises one of a supervised or unsupervised model, configured as a classification model.

13. The computer program product of claim 8, wherein the computer-readable instructions cause the one or more processors to determine whether a measured displacement of the chip-group connection point relative to the design connection point is different than a placement of the chip-group connection, based on the substrate layout design.

14. The computer program product of claim 13, wherein measuring a displacement of the chip-group comprises measuring placement of the chip-group with one of a metrology tool or a simulation.

15. A method comprising:
receiving design data and chip-group metadata;
patterning a chip-group including a chip-group connection point and a design connection point of a substrate layout design with a lithography tool;
measuring the chip-group relative to the design connection point to obtain displacement data;
providing the design data, the chip-group metadata, and the displacement data to a machine learning (ML) model;
transforming a pixel model of the substrate layout design to a transformed pixel model to make an electrical coupling; and
providing the transformed pixel model to the lithography tool for exposure of the transformed pixel model.

16. The method of claim 15, wherein the ML model is trained by a training component.

17. The method of claim 16, further comprising:
operating the model; and
training the model with a plurality of training pixel models, each training pixel model defining a path between a training design connection point and a training chip-group connection point of a training substrate design layer.

18. The method of claim 17, wherein the plurality of training pixel models is based on one or more of historical pixel model data or simulated pixel model data.

19. The method of claim 18, wherein the model comprises one of a supervised or unsupervised model, configured as a classification model.

20. The method of claim 15, wherein a measured displacement of the chip-group connection point relative to the design connection point is different than a placement of the chip-group connection, based on the substrate layout design.

* * * * *